United States Patent
Nagata et al.

(10) Patent No.: US 8,552,393 B2
(45) Date of Patent: Oct. 8, 2013

(54) RADIATION IMAGE CONVERSION PANEL AND RADIATION IMAGE DETECTOR USING SAME

(75) Inventors: Yasushi Nagata, Tokyo (JP); Keiko Maeda, Tokyo (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 13/574,447

(22) PCT Filed: Jan. 11, 2011

(86) PCT No.: PCT/JP2011/050253
§ 371 (c)(1),
(2), (4) Date: Jul. 20, 2012

(87) PCT Pub. No.: WO2011/089946
PCT Pub. Date: Jul. 28, 2011

(65) Prior Publication Data
US 2012/0294425 A1 Nov. 22, 2012

(30) Foreign Application Priority Data
Jan. 25, 2010 (JP) ................................. 2010-012929

(51) Int. Cl.
*G01T 1/20* (2006.01)
(52) U.S. Cl.
USPC ................................................. 250/370.11
(58) Field of Classification Search
USPC .................... 250/370.01–370.15, 366, 361 R
See application file for complete search history.

(56) References Cited

U.S. PATENT DOCUMENTS

| 7,135,277 | B2 * | 11/2006 | Ohzeki ........................ 430/619 |
| 2001/0018170 | A1 * | 8/2001 | Oyamada et al. ............. 430/620 |
| 2005/0069827 | A1 * | 3/2005 | Nariyuki et al. ............. 430/619 |
| 2005/0221241 | A1 * | 10/2005 | Nakagawa .................... 430/619 |
| 2005/0260529 | A1 * | 11/2005 | Oyamada et al. ............. 430/348 |

FOREIGN PATENT DOCUMENTS

| JP | 54-35060 | 10/1979 |
| JP | 63-215987 | 9/1988 |
| JP | 2003-107160 | 4/2003 |
| JP | 2006-250909 | 9/2006 |
| JP | 2008-051793 | 3/2008 |
| JP | 2009-047577 | 3/2009 |
| WO | 2007/060814 | 5/2007 |

* cited by examiner

*Primary Examiner* — Kiho Kim
(74) *Attorney, Agent, or Firm* — Lucas & Mercanti, LLP

(57) ABSTRACT

Disclosed is a radiation image conversion panel wherein luminance is improved by preventing the disorder of the structure of phosphor columnar crystals, thereby eliminating the scattering and refraction of optical elements which is emitted by an X-ray-irradiated phosphor and propagated in the direction of a photoelectric conversion element. Moreover disclosed is a radiation image detector using the same. The radiation image conversion panel is characterized in that the radiation image conversion panel comprises a phosphor layer on the substrate, that the phosphor layer is configured of the phosphor columnar crystals formed from a phosphor matrix compound and an activator by vapor deposition, and that the degree of the orientation of the surface of the phosphor columnar crystals, the degree of the orientation being based on X-ray diffraction spectrum and the surface having a fixed mirror index, is in the range of 80 to 100% without regard to the position in the direction of the thickness of the layer from the root near the substrate to the tip of the phosphor columnar crystals of the phosphor layer.

6 Claims, 3 Drawing Sheets

RADIATION IMAGE CONVERSION PANEL AND RADIATION IMAGE DETECTOR USING SAME

CROSS REFERENCE TO RELATED APPLICATION

This Application is a 371 of PCT/JP2011/050253 filed on Jan. 11, 2011 which, in turn, claimed the priority of Japanese Patent Application No 2010-012929 filed on Jan. 25, 2010, both applications are incorporated by reference herein.

TECHNICAL FIELD

The present invention relates to a radiation image conversion panel achieving an enhanced light emitting luminescence, and a radiation image detector using the same.

TECHNICAL BACKGROUND

There have been broadly employed radiographic images such as X-ray images for diagnosis of the conditions of patients in the medical sites. Specifically, radiographic images using an intensifying-screen/film system have achieved enhancement of speed and image quality over its long history and are still used on the scene of medical treatment as an imaging system having high reliability and superior cost performance in combination. However, these image data are so-called analog image data, in which free image processing or instantaneous image transfer cannot be realized.

Recently, there appeared digital system radiographic image detection apparatuses, as typified by a computed radiography (also denoted simply as CR) and a flat panel detector (also denoted simply as FPD). In these apparatuses, digital radiographic images are obtained directly and can be displayed on an image display apparatus such as a cathode tube or liquid crystal panels, which renders it unnecessary to form images on a photographic film. Accordingly, digital system radiographic image detection apparatuses have resulted in reduced necessities of image formation by a silver salt photographic system and leading to drastic improvement in convenience for diagnosis in hospitals or medical clinics.

The computed radiography (CR) as one of the digital technologies for radiographic imaging has been accepted mainly at medical sites. However, image sharpness is insufficient and spatial resolution is also insufficient, which have not yet reached the image quality level of the conventional screen/film system. Further, there appeared, as a digital X-ray imaging technology, an X-ray flat panel detector (FPD) using a thin film transistor (TFT), as described in, for example, the article "Amorphous Semiconductor Usher in Digital X-ray Imaging" described in Physics Today, November, 1997, page 24 and also in the article "Development of a High Resolution, Active Matrix, Flat-Panel Imager with Enhanced Fill Factor" described in SPIE, vol. 32, page 2 (1997).

In order to convert radiation to visible light, it is employed a scintillator panel made of an X-ray phosphor which is emissive for radiation. The use of a scintillator panel exhibiting enhanced emission efficiency is necessary for enhancement of the SN ratio in radiography at a relatively low dose. Generally, the emission efficiency of a scintillator panel depends on the phosphor layer thickness and X-ray absorbance of the phosphor. A thicker phosphor layer causes more scattering of emission within the phosphor layer, leading to deteriorated sharpness. Accordingly, necessary sharpness for desired image quality level necessarily determines the layer thickness.

Specifically, cesium iodide (CsI) exhibits a relatively high conversion rate of X-rays to visible light. Further, a columnar crystal structure of the phosphor can readily be formed through vapor deposition and its light guide effect inhibits scattering of emitted light within the crystal, enabling an increase of the phosphor layer thickness (refer to Patent document 1).

However, since the use of cesium iodide (CsI) alone exhibits a relatively low emission efficiency, so that there is proposed a mixture of CsI with sodium iodide (NaI) at any mixing ratio which is deposited on a substrate via vacuum evaporation as sodium-activated cesium iodide (CsI:Na); or recently, there is proposed a mixture of CsI with thallium iodide (TlI) at any mixing ratio which is deposited on a substrate via vacuum evaporation as thallium-activated cesium iodide (CsI:Tl), followed by subjected to annealing at 200 to 500° C. as a heat-treatment to improve visible conversion efficiency, and the resulting is used as an X-ray phosphor (for example, refer to Patent document 2).

It was found the following by the investigation of the present inventors: since the activator has a different crystal structure from the matrix phosphor compound, it will produce a problem of deteriorated sharpness caused by disorder of columnar crystal structure when the density of activator becomes high (refer to Patent document 3).

PRIOR ART DOCUMENTS

Patent Documents

Patent document 1: JP-A No. 63-215987
Patent document 2: Examined Japanese Patent Application Publication No. 54-35060
Patent document 3: JP-A No. 2009-47577

SUMMARY OF THE INVENTION

Problems to be Solved by the Invention

The present invention was made in view of the above-mentioned problem and circumstance. An object of the present invention is to provide a radiation image conversion panel which has been enhanced its luminance by preventing the disorder of the structure of a columnar phosphor crystal to result in eliminating scattering refraction of the light component which is emitted by X-ray exposure and is propagated in the direction of a photoelectric conversion element. An object of the present invention is to provide a radiation image detector which uses the same radiation image conversion panel.

Means to Solve the Problems

The foregoing objects of the present invention can be achieved according to the following constitution.

1. A radiation image conversion panel comprising a substrate having thereon a phosphor layer,
wherein the phosphor layer is composed of a phosphor columnar crystal which is formed from a phosphor matrix compound and an activator with a gas phase deposition process; and
the phosphor columnar crystal has an orientation degree in the range of 80 to 100% from a bottom near to the substrate to a top of the phosphor columnar crystal regardless of a position of the phosphor columnar crystal in a layer thickness direction, provided that the orientation degree is measured on a surface of the phosphor columnar crystal having a predetermined Miller index based on an X-ray diffraction spectrum.

2. The radiation image conversion panel of the aforesaid item 1, wherein the predetermined Miller index is (200).

3. The radiation image conversion panel of the aforesaid items 1 or 2, wherein the phosphor matrix compound to form the phosphor columnar crystal is an alkali halide phosphor compound of a cubic crystal.

4. The radiation image conversion panel of any one of the aforesaid items 1 to 3, wherein the phosphor matrix compound to form the phosphor columnar crystal is cesium iodide.

5. The radiation image conversion panel of the aforesaid item 4, wherein the activator is thallium.

6. A radiation image detector comprising a photoelectric conversion element which is located facing to the radiation image conversion panel of any one of the aforesaid items 1 to 5.

By using the above-described embodiments of the present invention, it is possible to provide a radiation image conversion panel which has been enhanced its luminance by preventing the disorder of the structure of a columnar phosphor crystal to result in eliminating scattering refraction of the light component which is emitted by X-ray exposure and is propagated in the direction of a photoelectric conversion element. Further, it is possible to provide a radiation image detector which uses the same radiation image conversion panel.

EMBODIMENTS OF THE INVENTION

Figure 1:
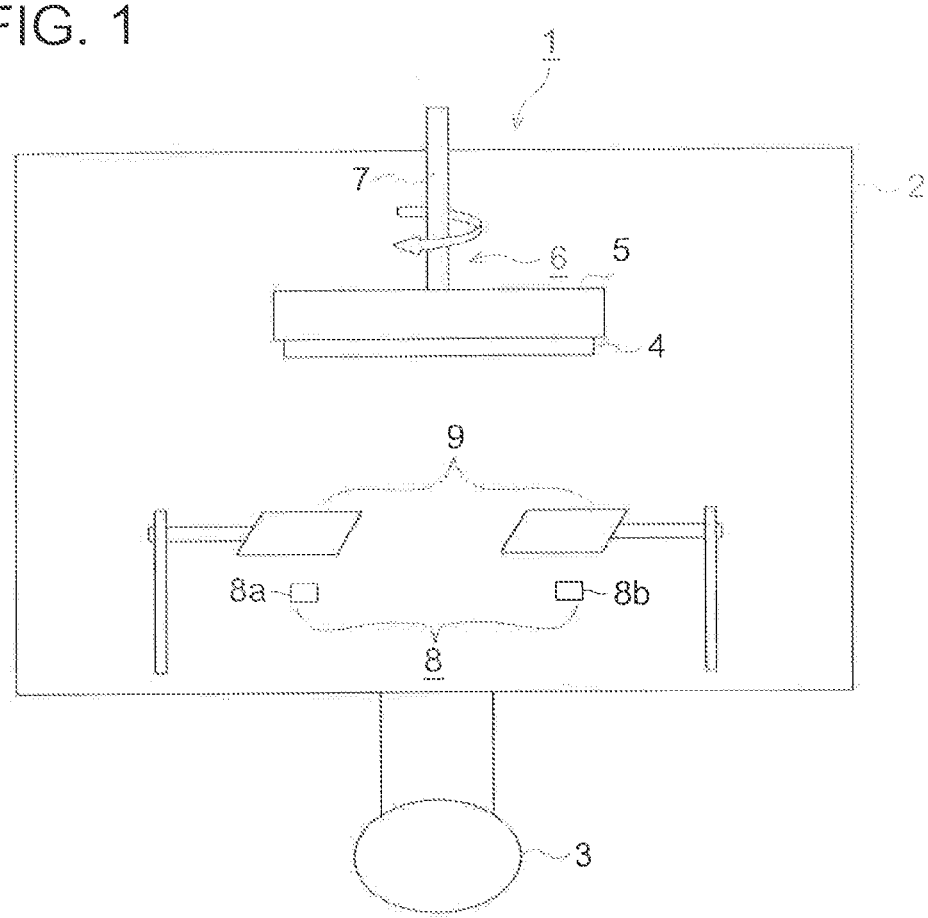
FIG. 1 is a schematic view of a production device of a scintillator panel.
Figure 2:
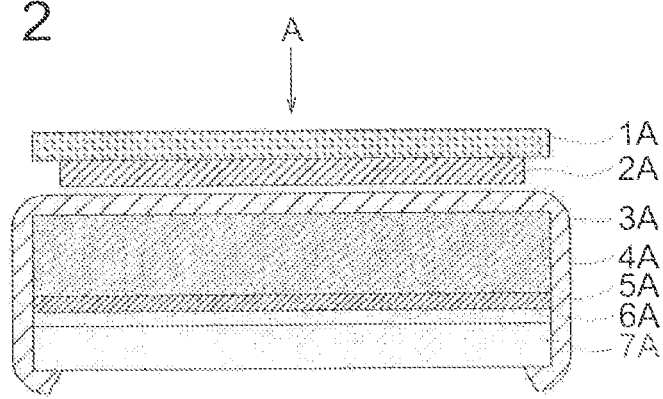
FIG. 2 is a schematic diagram to show an example of structure of a radiation image detector

A radiation image conversion panel of the present invention is a radiation image conversion panel comprising a substrate having thereon a phosphor layer, wherein the phosphor layer is composed of a phosphor columnar crystal which is formed from a phosphor matrix compound and an activator with a gas phase deposition process; and the phosphor columnar crystal has an orientation degree in the range of 80 to 100% from the bottom near to the substrate to the top of the phosphor columnar crystal regardless of a position of the phosphor columnar crystal in a layer thickness direction, provided that the orientation degree is measured on a surface of the phosphor columnar crystal having a predetermined Miller index based on an X-ray diffraction spectrum. These features are common technical features of the invention described in claim 1 to claim 6.

From the viewpoint of obtaining the effects of the present invention, as an embodiment of the present invention, it is preferable that the predetermined Miller index is (200). Hereafter, in the present invention, the symbol "–" is used to mean that the two numerals described before and after this symbol indicate the lowest value and the highest value, respectively, with including these values themselves.

In the present invention, it is preferable that the phosphor matrix compound to form the phosphor columnar crystal is an alkali halide phosphor compound of a cubic crystal. Specifically, it is preferable that the phosphor matrix compound to form the phosphor columnar crystal is cesium iodide. In that case, it is preferable that the phosphor columnar crystal contains thallium as an activator.

The present invention can be applicable to a stimulable phosphor. Specifically, it is also preferable that the phosphor matrix compound to form the phosphor columnar crystal is cesium bromide. In that case, it is preferable that the phosphor columnar crystal contains europium as an activator.

A radiation image conversion panel of the present invention is suitably used for a radiation image detector in which a photoelectric conversion element is located facing to the radiation image conversion panel.

In the present invention, "an orientation degree of a surface of the phosphor columnar crystal having a predetermined Miller index based on an X-ray diffraction spectrum" is defined as follows. When the intensity at (200) surface in an X-ray diffraction spectrum is set to be $I_{200}$, and the total intensity obtained by including other Miller indexes is set to be I, it is defined as: "the orientation degree=$I_{200}$/I".

Hereinafter, there will be detailed the present invention and its constituent features and preferred embodiments to carry out the present invention.

(Constitution of Radiation Image Conversion Panel)

A radiation image conversion panel of the present invention is a radiation image conversion panel comprising a substrate having thereon a phosphor layer; and the phosphor layer is composed of a phosphor columnar crystal which is formed from a phosphor matrix compound and an activator with a gas phase deposition process. And it is preferable to be provided with various types of functional layers which will be described later.

In the radiation image conversion panel of the present invention, the radiation image conversion panel may be formed as follows. On the first substrate, there is provided with a phosphor layer via a functional layer such as a reflection layer by a gas phase deposition process, then, it is adhered to or brought into contact with a photoelectric conversion panel formed on the second substrate provided with a photoelectric conversion element section (it is called as "a planar light receiving element") in which pixels made of a photosensor and TFT (Thin Film Transistor) or CCD (Charge Coupled Device) are two-dimensionally arranged. Alternatively, the radiation image conversion panel may be one in which, after forming a planar light receiving element on the substrate, the phosphor layer is provided directly or via a functional layer such as a reflection layer or a protective layer by a gas phase deposition process.

Hereinafter, there will be described, as typical examples, various constituent layers and constituent elements mainly in cases of forming a radiation image conversion panel (scintillator panel), but it is basically the same even in cases of forming at first a radiation image conversion panel in which a planar light receiving element is formed on the substrate, and then, a phosphor layer related to the present invention is directly provided thereon.

In the present application, "a scintillator" designates a phosphor which emits light by exciting an atom when irradiated with ionizing radiations such as α rays, β rays or X rays. That is, it is a phosphor which converts radiation to ultraviolet or visible rays. However, a stimulable phosphor mentioned later shall be excluded from a scintillator. "A stimulable phosphor" is a phosphor which emits a stimulable light by irradiating with a light stimulus (with a stimulating light having a wavelength of 500 nm to 1 μm) later in an amount corresponding to the first irradiation with ionizing radiations.

(Phosphor Layer)

In the phosphor layer relating to the present invention (also denoted as "a phosphor layer"), although there may be used various known phosphor matrix compounds, it is preferable that the phosphor matrix compound is an alkali halide phosphor compound of a cubic crystal.

For example, although a phosphor layer may be formed by using a cesium halide such as cesium iodide (CsI) or cesium bromide (CsBr) as a main component, it is preferable that the phosphor layer contains a columnar phosphor crystal composed of cesium iodide (CsI) as a matrix compound (main component). There are known various phosphor materials as a material to form a phosphor layer. Cesium iodide (CsI) has a high conversion rate from X-rays to visible rays, and it can easily form a phosphor in columnar crystal structure by vacuum evaporation. Therefore, scattering of the emitting light within a crystal is suppressed by the optical guide effect, and since it is possible to increase the thickness of a phosphor layer, the present invention is characterized in that the main component of the phosphor layer is made of cesium iodide (CsI).

However, since luminescence efficiency is low when only CsI only is used, various activators are added. For example, as described in JP-B No. 54-35060, it can be cited a mixture of CsI and sodium iodide (NaI) with an arbitrary molar ratio. Further, as described in JP-A No. 2000-59899, for example, it is preferable to use deposited CsI containing an activator such as thallium (Tl), europium (Eu), indium (In), lithium (Li), potassium (K), rubidium (Rb), or sodium (Na). In the present invention, thallium (Tl) is especially preferable. Moreover, in the case of a stimulable phosphor like CsBr, Eu can be used as an activator, for example.

In addition, in the present invention, it is especially preferable to use an additive containing at least one thallium compound and cesium iodide as raw materials. Namely, thallium activated cesium iodide (CsI:Tl) is preferable from the viewpoint that it has a large luminescence having a wave length from 400 nm to 750 nm.

As a thallium compound used for an additive which contains one or more kinds of thallium compounds concerning the present invention, it can be used various thallium compounds (compound having an oxidation number of +I and +III).

In the present invention, a preferable thallium compound is thallium iodide (TlI).

Moreover, as for the melting point of the thallium compound concerning the present invention, it is preferable that it is within the range of 400-700° C. When it exceeds 700° C., the additive will exist unevenly within a columnar crystal, and luminescence efficiency will fall. Here, the melting point in the present invention is a melting point under normal temperature and normal pressure.

In the phosphor layer of the present invention, the relative content of the activator in the phosphor layer is preferably 0.1-5 mol %. The relative content of the activator in the underlayer is preferably 0.01-1 mol %, and more preferably 0.1-0.7 mol %. Here, the relative content of an activator is shown by mole % of the activator to 1 mol of phosphor matrix compound. Especially, it is important that the underlayer contains the activator in an amount of 0.01 mol % or more from the viewpoint of improvement in luminescence and conservation. In the present invention, it is required that the relative content of the activator in an underlayer should be lower than the relative content in a phosphor layer. As for the ratio of the relative content of the activator in an underlayer to the relative content of the activator in a phosphor layer [(the relative content of the activator in an underlayer)/(the relative content in a phosphor layer)], it is desirable that it is 0.1-0.7.

The thickness of the phosphor layer is preferably 100-800 μm, and more preferably, 120-700 μm in order to achieve balanced characteristics of luminance and sharpness.

(Method for Forming Phosphor Columnar Crystal)

A phosphor layer of the present invention is composed of a phosphor columnar crystal which is formed from a phosphor matrix compound and an activator with a gas phase deposition process; and the phosphor columnar crystal has an orientation degree in the range of 80 to 100% from the bottom near to the substrate to the top of the phosphor columnar crystal regardless of a position of the phosphor columnar crystal in a layer thickness direction, provided that the orientation degree is measured on a surface of the phosphor columnar crystal having a predetermined Miller index based on an X-ray diffraction spectrum.

In the present invention, the orientation degree is preferably in the range of 95 to 100%. In addition, although the above-mentioned predetermined Miller index may be one of (100), (110), (111), (200), (211), (220), and (311), and it is preferable to be (200). (Regarding to the Miller index, refer to "Introduction of X-ray analysis", Tokyo Kagaku Dojin, Publisher.)

The phosphor columnar crystal relating to the present invention is required to be formed with a gas phase deposition process. The vapor phase deposition process may employ a vapor deposition method, a sputtering method, a CVD method, an ion-plating method or the like, of which the vapor deposition method is specifically preferred in the present invention.

In the present invention, it is preferable that the phosphor layer is composed of a phosphor formed from a phosphor matrix compound and an activator, and that there is provided with an underlayer between the substrate (support) and the phosphor layer which is formed from the aforesaid phosphor matrix compound and the activator. Further, it is preferable that the relative content of the activator in the underlayer is smaller than the relative content of the activator in the phosphor layer.

In order to satisfy the above-described requirement for the Miller index, it is preferable to use an embodiment of the forming method of a phosphor columnar crystal relating to the present invention containing the following steps: a step of forming an underlayer on the substrate so that the relative content of the activator in the underlayer becomes lower than the relative content of the activator in the phosphor layer; a step of depositing the phosphor on the underlayer with a gas phase deposition process so as to form a phosphor layer having a higher relative density than that of the underlayer.

By the presence of the underlayer, the columnar crystallizing property of the phosphor layer becomes unproved, and an amount of luminescence will be increased to result in enhancement of the luminescence of the conversion panel and improved storage stability.

The underlayer, which is one of specific requirements of the present invention, is an underlayer having a lower relative content of the activator therein than the relative content of the activator in the phosphor layer.

In the present invention, it is required that the relative density of the underlayer is lower than the relative density of the phosphor layer. The ratio of the relative density of the underlayer to the relative density of the phosphor layer [(relative density of the underlayer)/(relative density of the phosphor layer)] is preferably to be 0.92-0.98.

In addition, in the present invention, "a relative density (%)" means a relative value (percentage) of the real specific density (g/cm$^3$) of each layer (underlayer or phosphor layer) with respect to the specific density (g/cm$^3$) of the phosphor itself.

The thickness of the underlayer is preferably a value which satisfies the following relationship to the thickness of the phosphor layer. For example, when the thickness of the phosphor layer is 500 μm, the thickness of the underlayer is preferably larger 5 μm and smaller than 500 μm.

Relationship:

0.01<(The thickness of the underlayer/the thickness of the phosphor layer)<0.5

In the present invention, it is preferable that the underlayer is formed with a gas phase deposition process in the same manner as forming the phosphor layer. When the underlayer is formed with a gas phase deposition process such as a vapor deposition method, the underlayer will be generally composed of an aggregation of spherical crystals having a diameter of several μm, or the underlayer will have a columnar crystal structure.

(Determination Method of Orientation Degree)

An X-ray diffraction method (XRD) is used for the determination of an orientation degree. An X-ray diffraction method is an analytical method having high flexibility. It can acquire the knowledge about the identity of the substance, the structure of a crystal phase, etc. by using occurrence of a diffraction satisfying Bragg's equation which is obtained by irradiating a crystalline substance with X-rays of specific wavelength. Cu, Fe, Co, etc. are used as an irradiation target system. Although it depends on the ability of the device, generally, the output at the time of an irradiation is about 0-50 mA and 0-50 kV.

Although the size of the samples to measure with an XRD method depends on the power of the XRD apparatus, generally, it is preferable to be at least 5 mm×5 mm or more. The prepared sample has to be cut in the depth direction in order to measure a Miller index in the depth direction with XRD. To cut the sample, the sample is embedded in a resin, for example. First, the surface of the embedded sample is measured with XRD. Diffraction strength of each Miller index of the surface of the phosphor layer is obtained from an incident angle 2θ of 10-100°.

Next, cutting is done using a diamond knife or a glass knife to obtain a sample having a predetermined thickness. And XRD measurement is done. This process is repeated. For example, a (200) orientation degree is determined by calculating the ratio of the (200) surface strength $I_{200}$ with respect to the total strength I which is obtained from the all of the Miller indexes.

(Reflection Layer)

In the present invention, there may be provided with a reflection layer (also denoted as a metal reflection layer) on the support (substrate). The reflection layer reflects light emitted from a phosphor (scintillator), resulting in enhanced light-extraction efficiency. The reflection layer is preferably formed of a material containing an element selected from the group consisting of Al, Ag, Cr, Cu, Ni, Ti, Mg, Rh, Pt, and Au.

It is specifically preferred to employ a metal thin-film composed of the foregoing elements, for example, Ag film or Al film. Such a metal film may be formed of two or more layers. The thickness of a reflection layer is preferably 0.005-0.3 μm from the viewpoint of emission-extraction efficiency, and more preferably 0.01-0.2 μm.

The reflection layer related to the present invention may be formed by any method known in the art, including, for example, a sputtering treatment by use of the foregoing raw material.

(Metal Protective Layer)

The radiation image conversion panel (it is also called as a scintillator panel) related to the present invention may be provided, on the foregoing reflection layer, with a metal protective layer.

The metal protective layer is preferably formed by coating a resin dissolved in a solvent and drying it. A polymer exhibiting a glass transition point of 30 to 100° C. is preferred in terms of adhesion of deposited crystals to a support (substrate). Specific examples of such polymer include a polyurethane, vinyl chloride copolymer, poly[(vinyl chloride)-co-(vinyl acetate)], poly[(vinyl chloride)-co-(vinylidene chloride)], poly[(vinyl chloride)-co-acrylonitrile], poly(butadiene-co-aciylonitrile), polyvinyl acetal, polyester, cellulose derivatives (e.g., nitrocellulose), polyimide, polyamide, poly-p-xylylene, poly(styrene-co-butadiene), various synthetic rubber resins, phenol resin, epoxy resin, urea resin, melamine resin, phenoxy resin, silicone resin, acryl resin and urea formamide resin. Of these, a polyester resin is preferred.

The thickness of a metal protective layer is preferably 0.1 μm or more from the viewpoint of adhesion property and 3.0 μm or less to achieve smoothness of the metal protective layer surface, and more preferably it is in the range of 0.2-2.5 μm.

Examples of a solvent used for the metal protective layer include a lower alcohol such as methanol, ethanol, n-propanol or n-butanol; a chlorine-containing hydrocarbon such as methylene chloride or ethylene chloride; a ketone such as acetone, methyl ethyl ketone or methyl isobutyl ketone; an aromatic compound such as toluene, benzene, cyclohexane, cyclohexanone or xylene; an ester of a lower carboxylic acid and a lower alcohol, such as methyl acetate, ethyl acetate or butyl acetate; an ether such as dioxane, ethylene glycol monoethyl ester, or ethylene glycol monomethyl ester, and an ether such as dioxane, ethylene glycol monoethyl ester, or ethylene glycol monomethyl ester.

(Sublayer)

In the present invention, it is preferable from the viewpoint of adhesion to provide a sublayer between a support (substrate) and an underlayer, or between a reflection layer and an underlayer. Such a sublayer preferably contains a polymer binder (binder), a dispersing agent or the like. The thickness of a sublayer is preferably from 0.5-4 μm. There will be further described constituents of a sublayer.

<Polymer Binder>

The sublayer related to the invention is formed preferably by coating a polymer binder (hereinafter, also denoted simply as a binder) dissolved or dispersed in a solvent, followed by drying. Specific examples of such a polymer binder include a polyurethane, vinyl chloride copolymer, poly[(vinyl chloride)-co-(vinyl acetate)], poly[(vinyl chloride)-co-(vinylidene chloride)], poly[(vinyl chloride)-co-acrylonitrile], poly(butadiene-co-acrylonitrile), polyvinyl acetal, polyester, cellulose derivatives (e.g., nitrocellulose), polyimide, polyamide, poly-p-xylylene, poly(styrene-co-butadiene), various synthetic rubber resins, phenol resin, epoxy resin, urea resin, melamine resin, phenoxy resin, silicone resin, acryl resin and urea formamide resin. Of these, it is preferred to employ a polyester, a vinyl chloride copolymer, polyvinyl butyral or nitrocellulose.

A preferable polymer binder is a polyurethane, a polyester, a vinyl chloride copolymer, polyvinyl butyral or nitrocellulose, from the viewpoint of close adhesion with a phosphor layer. A polymer with a glass transition temperature (Tg) of 30-100° C. is specifically preferred from the viewpoint of adhesion between a deposited crystal and a support (substrate). Especially, a polyester resin is preferable from this viewpoint.

Examples of a solvent for use in preparation of a sublayer include a lower alcohol such as methanol, ethanol, n-propanol or n-butanol; a chlorine-containing hydrocarbon such as methylene chloride or ethylene chloride; a ketone such as acetone, methyl ethyl ketone or methyl isobutyl ketone; an aromatic compound such as toluene, benzene, cyclohexane, cyclohexanone or xylene; an ester of a lower carboxylic acid and a lower alcohol, such as methyl acetate, ethyl acetate or butyl acetate; an ether such as dioxane, ethylene glycol monoethyl ester, or ethylene glycol monomethyl ester; and an ether such as dioxane, ethylene glycol monoethyl ester, or ethylene glycol monomethyl ester; and a mixture of these solvents.

The sublayer may contain a pigment or a dye to inhibit scattering of light emitted from a phosphor (scintillator) to achieve enhanced sharpness.

(Protective Layer)

In the present invention, a protective layer mainly aims to protect a phosphor layer. Namely, cesium iodide (CsI) is a hygroscopic material, and absorbs moisture from the atmosphere to deliquesce, therefore, a protective layer has a main aim to inhibit this.

The protective layer can be formed by use of various materials. For instance, it is formed with a p-xylylene membrane by a CVD process. Namely, it is formed with a p-xylylene layer on all of the surfaces of a scintillator and a substrate, whereby a protective layer is formed.

Alternatively, a polymer film may be provided on the phosphor layer. A material of such a polymer film may employ a film similar to a polymer film as a support (substrate) material, as described later.

The thickness of a polymer film is preferably not less than 12 μm and not more than 120 μm, and more preferably not less than 20 μm and not more than 80 μm, taking into account formability of void portions, protectiveness of a phosphor layer, sharpness, moisture resistance and workability. Taking into account sharpness, uniformity of radiation image, production stability and workability, the haze factor is preferably not less than 3% and not more than 40%, and more preferably not less than 3% and not more than 10%. The haze factor is determined by using, for example, NDH 500W, made by Nippon Denshoku Kogyo Co., Ltd. Such a haze factor can be achieved by choosing commercially available polymer films.

Taking into account photoelectric conversion efficiency and scintillator emission wavelength, the light transmittance of the protective film is preferably not less than 70% at 550 nm; however, a film with light transmittance of 99% or more is not commercially available, so that it is substantially preferred to be from 70% to 99%.

Taking into account protectiveness and deliquescence of a scintillator layer, the moisture permeability of the protective film is preferably not more than 50 g/m$^2$·day (40° C., 90% RH, measured in accordance with JIS Z 0208) and more preferably not more than 10 g/m$^2$·day (40° C., 90% RH, measured in accordance with JIS Z 0208); however, a film of not more than 0.01 g/m$^2$·day (40° C., 90% RH) is not commercially available, so that it is substantially preferred to be not less than 0.01 g/m$^2$·day (40° C., 90% RH) and not more than 50 g/m$^2$·day (40° C., 90% RH, measured in accordance with JIS Z 0208), and it is more preferred to be not less than 0.1 g/m$^2$·day (40° C., 90% RH) and not more than 10 g/m$^2$·day (40° C., 90% RH, measured in accordance with JIS Z 0208).

(Support: Substrate)

In the invention, the support (also denoted as a substrate) is preferably a quartz glass sheet, a metal sheet such as aluminum, iron, tin or chromium, a carbon fiber-reinforced sheet, or a polymer film.

Usable polymer films include cellulose acetate film, polyester film, polyethylene terephthalate film, polyamide film, polyimide film, triacetate film, polycarbonate film and carbon fiber reinforced resin. A polymer film containing a polyimide or polyethylene naphthalate is specifically suitable when forming phosphor columnar crystals with a raw material of cesium iodide by a process of vapor phase deposition.

A polymer film used for the support (substrate) related to the invention preferably is preferably a 50-500 μm thick, flexible polymer film.

Herein, the flexible support (substrate) refers to a substrate exhibiting an elastic modulus at 120° C. (also denoted as E120) of 1,000-6,000 N/mm$^2$. Such a substrate is preferably a polymer film containing polyimide or polyethylene terephthalate.

In the region showing a linear relationship between strain and corresponding stress which is measured by using a tensile strength tester based on JIS C 2318, the elastic modulus is calculated as the slope of the straight portion of the stress-strain curve, that is, a strain divided by a stress. It is also referred to as a Young's modulus. In the present invention, a Young's modulus is also defined as the elastic modulus.

The support (substrate) used in the present invention preferably exhibits an elastic modulus at 120° C. (E120) of 1,000 to 6,000 N/mm$^2$, and more preferably 1,200 to 5,000 N/mm$^2$.

Specific examples include a polymer film made of polyethylene naphthalate (E120=4,100 N/mm$^2$), polyethylene terephthalate (E120=1,500 N/mm$^2$), polybutylene naphthalate (E120=1,600 N/mm$^2$), polycarbonate (E120=1,700 N/mm$^2$), syndiotactic polystyrene (E120=2,200 N/mm$^2$), polyether imide (E120=1,900 N/mm$^2$), polyimide (E120=1,200 N/mm$^2$), polyacrylate (E120=1,700 N/mm$^2$), polysulfone (E120=1,800 N/mm$^2$) or polyether sulfone (E120=1,700 N/mm$^2$).

These may be used singly or by mixing, or laminated. Of these polymer films, a polymer film comprising polyimide or polyethylene naphthalate is preferred.

Adhesion of the radiation image conversion panel (it is also called as a scintillator panel) to the surface of a planar light receiving element is often affected by deformation or warpage of the support (substrate) during deposition, rendering it difficult to achieve a uniform image quality characteristic within the light receiving surface of a light receiving element. In such a case, a 50-500 μm thick polymer film is used as a support (substrate), whereby the scintillator panel is deformed with being fitted to the form of the surface of a planar light receiving element, leading to uniform sharpness over all of the light-receiving surface of the flat panel detector.

The support may be provided with a resin layer to make the surface smooth. The resin layer preferably contains a compound such as polyimide, polyethylene terephthalate, paraffin or graphite, and the thickness thereof preferably is approximately 5 μm-50 μm. The resin layer may be provided on the front surface or back surface of the support.

Means for providing an adhesion layer on the support surface include, for example, a pasting method and a coating method. Of these, the pasting method is conducted by using heat or a pressure roller preferably in the heating condition of approximately 80-150° C., a pressure condition of 4.90×10 to 2.94×10$^2$ N/cm and a conveyance rate of 0.1-2.0 m/sec.

(Production Method of Radiation Image Conversion Panel)

A production method of the radiation image conversion panel (or may be called as "a scintillator panel") related to the present invention is preferably one in which, using an evaporation device having an evaporation source and a support rotation mechanism provided within a vacuum vessel, a support is placed on the rotation mechanism and a phosphor layer is formed by a vapor phase deposition process of evaporating a phosphor material, while rotating the support rotation mechanism.

In the following, there will be described the embodiments of the invention with reference to FIG. 1.

(Production Device of Radiation Image Conversion Panel)

FIG. 1 illustrates a schematic constitution of a production device of a radiation image conversion panel (scintillator panel) relating to the present invention. As illustrated in FIG. 1, a production device 1 of a radiation image conversion panel (scintillator panel) is provided with a vacuum vessel 2. The vacuum vessel 2 is provided with a vacuum pump 3 to evacuate the inside of the vacuum vessel 2 and to introduce atmosphere.

A support holder 5 to hold a support 4 is provided near the topside within the vacuum vessel 2.

A phosphor layer is formed on the surface of the support 4 by a process of vapor phase deposition. The vapor phase deposition process may employ a vapor deposition method, a sputtering method, a CVD method, an ion-plating method or the like, of which the vapor deposition method is specifically preferred in the present invention.

The support holder 5 has a composition to support the support 4 so that the support surface on which forms the phosphor layer is opposed to and is also parallel to the bottom face of the vacuum vessel 2.

The support holder 5 is preferably provided with a heater (which is not shown in the drawing) to heat the support 4. Heating the support 4 by the heater achieves enhanced contact of the support 4 to the support holder 5 and controls layer quality of the phosphor layer. Further, adsorbate on the surface of the support 4 is also eliminated or removed to inhibit generation of an impurity layer between the surface of the support 4 and a phosphor described above.

Further, there may be provided, as a heating means, a mechanism (not shown in the drawing) to circulate a warming medium or heating medium. Such a means is suitable when performing vapor deposition with maintaining the support 4 at a relatively low temperature of 50-150° C.

There may be provided a halogen lamp (not shown in the drawing) as a heating means. This means is suitable when performing vapor deposition with maintaining the support 4 at a relatively high temperature of not less than 150° C.

The support holder 5 is provided with a rotation mechanism 6 to rotate the support 4 in the horizontal direction. The support rotation mechanism 6 is constituted of a support rotation shaft 7 to rotating the support 4 with supporting the support holder 5 and a motor (not shown in the drawing) which is disposed outside the vacuum vessel and is a driving source of the support rotation shaft 7.

In the vicinity of the bottom surface within the vacuum vessel 2, evaporation sources 8a and 8b are disposed at positions opposed to each other on the circumference of a circle centered on a center line vertical to the support 4. In that case, the distance between the support 4 and the evaporation sources 8a or 8b is preferably from 100 to 1,500 mm, and more preferably from 200 to 1,000 mm. Further, the distance the center line vertical to the substrate 1 and the evaporation sources 8a and 8b is preferably from 100 to 1,500 mm, and more preferably from 200 to 1,000 mm.

The production device of a radiation image conversion panel (scintillator panel), usable in the present invention may be provided with three or more evaporation sources, in which the individual evaporation sources may be disposed at equivalent intervals or different intervals. The radius of a circle centered on a center line vertical to the support 4 can arbitrarily be set.

The evaporation sources 8a and 8b, which house a phosphor and heat it by a resistance heating method, may be constituted of an alumina crucible wound by a heater, a boat or a heater of a metal with a high melting point. Methods of heating a phosphor include heating by an electron beam and high-frequency induction heating, but in the invention, a method of resistance-heating by direct current or a method of resistance-heating indirectly a crucible by a circumferential heater is preferable in terms of ease of operation by a relatively simple constitution and low price and also being applicable to many substances. The evaporation sources 8a and 8b may employ a molecular beam source by a molecular source epitaxial method.

A shutter 9 which is openable in the horizontal direction is provided between the evaporation sources 8a or 8b and the substrate 1 to intercept the space from the evaporation source 8a or 8b to the support 4; this shutter 9 prevents substances except the objective material which were attached to the phosphor surface and have been evaporated at the initial stage of vapor deposition from adhering onto the support 4.

<Production Method of Radiation Image Conversion Panel (Scintillator Panel)>

Next, there will be described a production method of a radiation image conversion panel (scintillator panel) related to the invention by using the foregoing production device 1 of the radiation image conversion panel (scintillator panel).

First, the support 4 is placed onto the support holder 5. Further, evaporation sources 8a and 8b are disposed on the circumference of a circle centered on a center line vertical to the substrate 1 in the vicinity of the bottom of the vacuum vessel 2. In that case, the space between the substrate 1 and the evaporation sources 8a or 8b is preferably from 100-1,500 mm, and more preferably from 200-1,000 mm. The space between the center line vertical to the support 4 and the evaporation sources 8a or 8b is preferably from 100-1,500 mm, and more preferably from 200-1,000 mm.

Subsequently, the inside of the vacuum vessel 2 is evacuated to control the evacuation degree to a medium level of $1 \times 10^{-2}$ to 10 Pa. More preferably, it is evaluated to an evacuation degree of $1 \times 10^{-5}$ to $1 \times 10^{-2}$ Pa. After achieving to an evacuation degree of $1 \times 10^{-5}$ to $1 \times 10^{-2}$ Pa by evacuating the inside of the device, it is introduced an inert gas such as an Ar gas, a Ne gas, or a $N_2$ gas to achieve the above-described evacuation degree of a medium level.

Thereafter, the support holder 5 is rotated with respect to the evaporation sources 8a and 8b by the rotation mechanism 6. Then, a phosphor is evaporated from the heated evaporation sources 8a and 8b, whereby the phosphor is grown to a desired thickness on the surface of the support 4. By this, it can be decrease a water partial pressure or an oxygen partial pressure. Examples of a usable evacuation device include: a rotary pump, a turbo molecular pump, a cryo pump, a diffusion pump, a mechanical booster and a suitable combination of these.

The process of growing a phosphor on the surface of the support 4 may be divided to plural steps to form a phosphor layer.

In the vapor deposition method, a material subject to deposition (the support 4, protective layer or intermediate layer) may appropriately be heated or cooled during vapor deposition.

After completing vapor deposition, the phosphor layer may be subjected to a heating treatment. There may be also conducted a reactive deposition in which deposition is performed, while introducing gas such as $O_2$ or $H_2$.

The thickness of the formed phosphor layer, which is different depending on intended use of a radiation image conversion panel, is from 50-2,000 μm, preferably 50-1,000 μm, and more preferably from 100-800 μm.

The temperature of the support 4 at which a phosphor layer is formed, is set preferably to the range of room temperature (rt)—300° C., and more preferably 50-250° C.

When the panel contains a plurality of phosphor layers, the temperature of the support 4 on which is formed the first phosphor layer (under layer) is preferably set to be 80° C. or less, more preferably to the range of room temperature (rt)—80° C. The temperature of the support 4 on which is formed the second phosphor layer (a phosphor layer on the under layer) is preferably set to 150-250° C.

After forming the phosphor layer, a protective layer to physically or chemically protect the phosphor layer may be provided on the phosphor layer opposite to the support 4. A coating solution for a protective layer may be directly coated onto the phosphor layer surface or a protective layer which was previously formed may be adhered to the phosphor layer. The thickness of such a protective layer is preferably from 0.1 μm-2,000 μm.

Alternatively, a protective layer may be formed by depositing an inorganic substance such as SiC, $SiO_2$, SiN or $Al_2O_3$ through a vapor deposition method, sputtering method or the like.

In the present invention, there may be provided various functional layers other than the protective layer.

In the production device 1 for a radiation image conversion panel (scintillator panel) or the production method thereof, plural evaporation sources 8a and 8b are provided, whereby the overlapping portion of vapor streams from evaporation sources 8a and 8b are straightened, resulting in uniform crystallinity of a phosphor deposited on the surface of the support 4. In that case, more evaporation sources are provided, vapor streams are straightened at a larger number of portions, resulting in uniform crystallinity over a broader region. Further, when evaporation sources 8a and 8b are disposed on the circumference of a circle entered on a center line vertical to the support 4, effect of uniform crystallinity by straightening vapor streams can be isotropically achieved on the surface of the support 4.

Further, performing deposition of a phosphor with rotating the support 4 by the support rotation mechanism 6 can achieve uniform deposition of the phosphor on the surface of the support 4.

In the production device 1 or the production method of the radiation image conversion panel (scintillator panel) related to the invention, as described above, the phosphor layer is allowed to grow so that the crystallinity of the phosphor becomes uniform, thereby achieving enhanced sharpness in the radiation image obtained from the radiation image detector by using the scintillator panel related to the invention.

Further, restriction of the incident angle of the foregoing phosphor to be deposited on the support 4 to the prescribed region to inhibit fluctuation in the incident angle of the phosphor will result in uniformity crystallinity of the phosphor and enhanced sharpness of the obtained radiation image.

In the foregoing, there are described cases when the support holder 5 is provided with the support rotation mechanism 6, but the invention is not limited to these but is also applicable to those cases, including, for example, the case of performing evaporation, while the support holder 5 holding the support 4 at rest; and the case of depositing the phosphor from the evaporation sources 8a and 8b, while the support 4 is in the horizontal direction to the evaporation sources 8a and 8b.

(Radiation Image Detector)

The radiation image detector of the present invention (also denoted as a radiation image conversion panel or radiation flat panel detector) may be obtained by adhering or contacting a scintillator panel which is provided with a phosphor layer formed on the first support (substrate) by the vapor phase deposition process through a functional layer such as a reflection layer, to a photoelectric conversion panel provided, on the second substrate, with a photoelectric conversion element section (or planar light receiving element) in which picture elements comprised of a photosensor and a TFT (Thin Film Transistor) or CCD (Charge Coupled Device) are two-dimensionally arranged. Alternatively, it may be obtained by forming the photoelectric conversion element section in which picture elements comprised of a photosensor and a TFT or CCD are two-dimensionally arranged, followed by providing the phosphor layer related to the present invention by the process of vapor phase deposition directly or through a functional layer such as a reflection layer or a protective layer.

Namely, the radiation image detector of the present invention is required to be one which is provided, as a basic constitution, with a phosphor layer and a light-receiving element (hereinafter, also denoted as a planar light-receiving element) in which plural light-receiving elements are two-dimensionally arranged. Accordingly, the planar light-receiving element converting emission from the phosphor layer to a charge makes it feasible to digitize the image data.

The average surface roughness (Ra) of the outermost surface opposing to the phosphor layer of the planar light-receiving element related to the present invention is preferably within the range of 0.001-0.5 μm. Accordingly, it is preferred that after forming a light-receiving element on the glass surface, an organic resin film such as polyester of acryl is formed on the surface and the surface roughness is controlled by a photo-etching method so that the relevant requirements are met. The average surface roughness (Ra) of the planar light receiving element is preferably 0.001-0.1 μm, and more preferably 0.001-0.05 μm.

The radiation image detector of the present invention is preferably in the form of a radiation image conversion panel (scintillator panel) being pressed to a planar light-receiving element by an elastic member (such as a sponge, spring or the like) to achieve close contact. It is also a preferred embodiment that the radiation image conversion panel (scintillator panel) is brought into contact with the planar light-receiving element by evacuating the space between the scintillator panel and the planar light-receiving element and the circumference is sealed with an adhesive sealing member. Such an adhesive sealing member is preferably an ultraviolet-curable resin.

It is also a preferred embodiment that the radiation image conversion panel (scintillator panel) is provided with a phosphor layer and the phosphor layer is directly in contact with a planar light-receiving element.

Such ultraviolet-curable resins are not specifically restricted but can be selected appropriately from those known in the art. These ultraviolet-curable resins contain a photopolymerizable prepolymer or photopolymerizable monomer and a photopolymerization initiator or a photosensitizer.

Examples of such a photopolymerizable prepolymer include a polyester-acrylate one, an epoxy-acrylate one, a urethane acrylate one and a polyol-acrylate one. These photopolymerizable pre-polymers may be used singly or in combination. Examples of a photopolymerizable monomer include polymethylolpropane tri(meth)acrylate, hexanediol (meth)acrylate, tripropylene glycol di(meth)acrylate, diethylene glycol di(meth)acrylate, pentaerythritol tri(meth)acrylate, dipentaerythritol hexa(meth)acrylate, 1,6-hexanediol di(meth)acrylate, and neopentyl glycol di(meth)acrylate.

In the invention, it is preferable to use a urethane acrylate as a prepolymer and a dipentaerythritol hexa(meth)acrylate as a monomer.

Examples of a photopolymerization initiator include acetophenones, benzophenones, α-amyloxime ester, tetramethyl-thiurum monosulfide, and thioxanthones. Further, n-butylamine, triethylamine and poly-n-butylphosphine are mixedly used as a photosensitizer.

EXAMPLES

Hereinafter, the present invention will be further described with reference to examples but the embodiments of the present invention are by no means limited to these examples.

Example (Formation of Phosphor Layer)

On a protective layer side of a substrate were deposited a phosphor matrix compound (CsI: without activator) and an activator (TlI) using a vapor deposition device as illustrated in FIG. 1 to form a phosphor layer in the following manner.

First, the phosphor matrix compound (CsI: without activator) was placed in two resistive heating crucibles, and the activator (TlI) was placed in one resistive heating crucible. The substrate was placed in a metal frame of a support holder which was able to rotate. The distance between the substrate and the evaporation sources was adjusted to 400 mm.

Subsequently, after the interior of the vacuum vessel was evacuated, the vacuum degree was adjusted to 0.5 Pa by introducing an Ar gas and the substrate was rotated at a rate of 6 rpm. At this stage, the temperature of the substrate was maintained at 20° C. Next, one of the resistive heating crucibles placed with the phosphor matrix compound (CsI: without activator) was heated to deposit the phosphor. Thus a first layer (a first phosphor layer: underlayer) was formed with a thickness of 10 μm. At this stage, the temperature of the substrate was 40° C. Subsequently, heating of the substrate was started, and when the temperature of the substrate reached 200° C., it was kept at 200° C. Then, it was started to heat another resistive heating crucibles placed with the phosphor matrix compound (CsI: without activator) and the resistive heating crucibles placed with the activator (TlI). At this moment, the phosphor matrix compound began to evaporate at an evaporation rate of 10 times faster than the rate of the first layer. The evaporation rate of the activator was controlled so as to become ½ of the initial evaporation rate when formation of a second layer (a second phosphor layer) was completed. When the thickness of a phosphor layer reached 400 μm, evaporation was terminated to form a second phosphor layer. Thus, it was produced a radiation image conversion panel which was formed a phosphor layer (CsI:0.003 Tl; content of Tl was 0.3 mol %) on the substrate.

Comparative Example

On a protective layer side of a substrate was deposited a phosphor matrix compound (CsI: with an activator TlI) using a vapor deposition device as illustrated in FIG. 1 to form a phosphor layer in the following manner.

First, the phosphor matrix compound (CsI: with an activator TlI) was placed in a resistive heating crucible. The substrate was placed in a metal frame of a support holder which was able to rotate. The distance between the substrate and the evaporation sources was adjusted to 400 mm.

Subsequently, after the interior of the vacuum vessel was evacuated, the vacuum degree was adjusted to 0.5 Pa by introducing an Ar gas and the substrate was rotated at a rate of 6 rpm. At this stage, the temperature of the substrate was 200° C. Then, the resistive heating crucible placed with the phosphor compound (CsI: with and activator TlI) was heated to evaporate the phosphor. When the thickness of a phosphor layer reached 400 μm, evaporation was terminated to form a phosphor layer. Thus, it was produced a radiation image conversion panel which was formed a phosphor layer (CsI: 0.003 Tl; content of Tl was 0.3 mol %) on the substrate.

(Measuring Method of XRD)

The produced radiation image conversion panel was embedded in a resin, and an orientation of the phosphor layer in the layer depth direction was measured with XRD measurement. An instrument of Pert Pro MPD (made by PANalytica Co., Ltd.; Irradiation system: target Cu; output: 40 mV, 45 kV) was used for XRD measurement.

Figure 3:
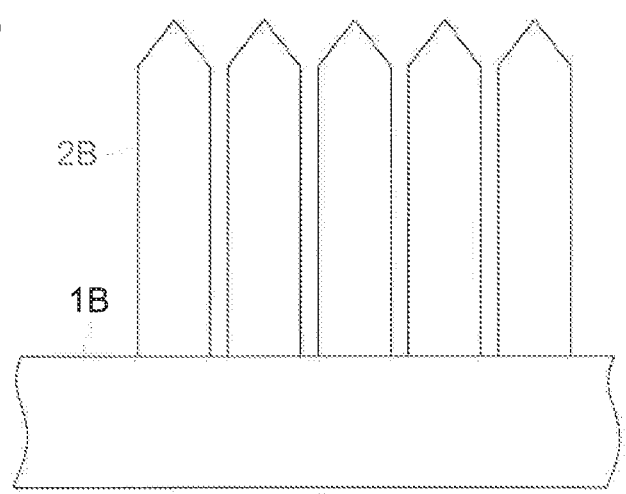
FIG. 3 is a schematic diagram to show an example of a columnar crystal shape.
Figure 4:
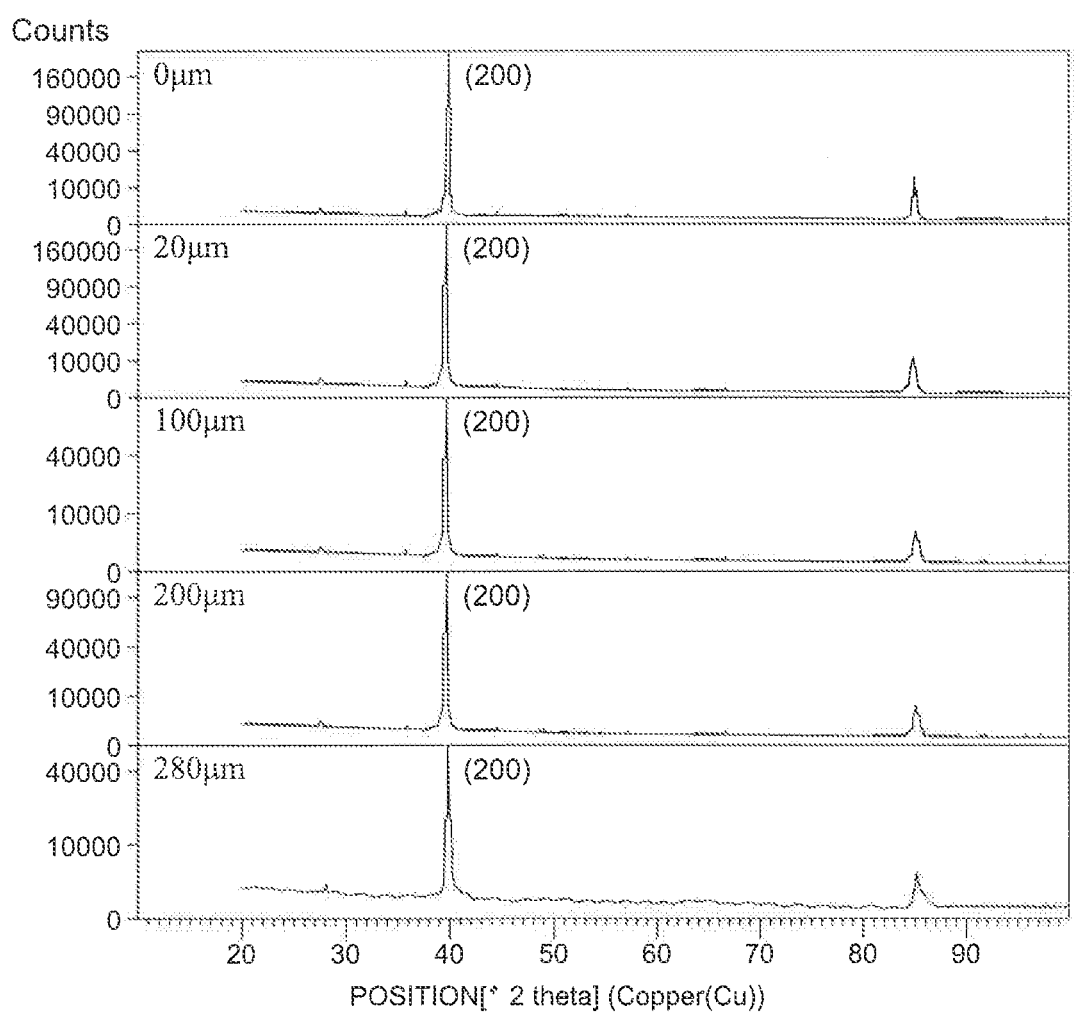
FIG. 4 shows an example of an X-ray diffraction spectrum.
Figure 5:
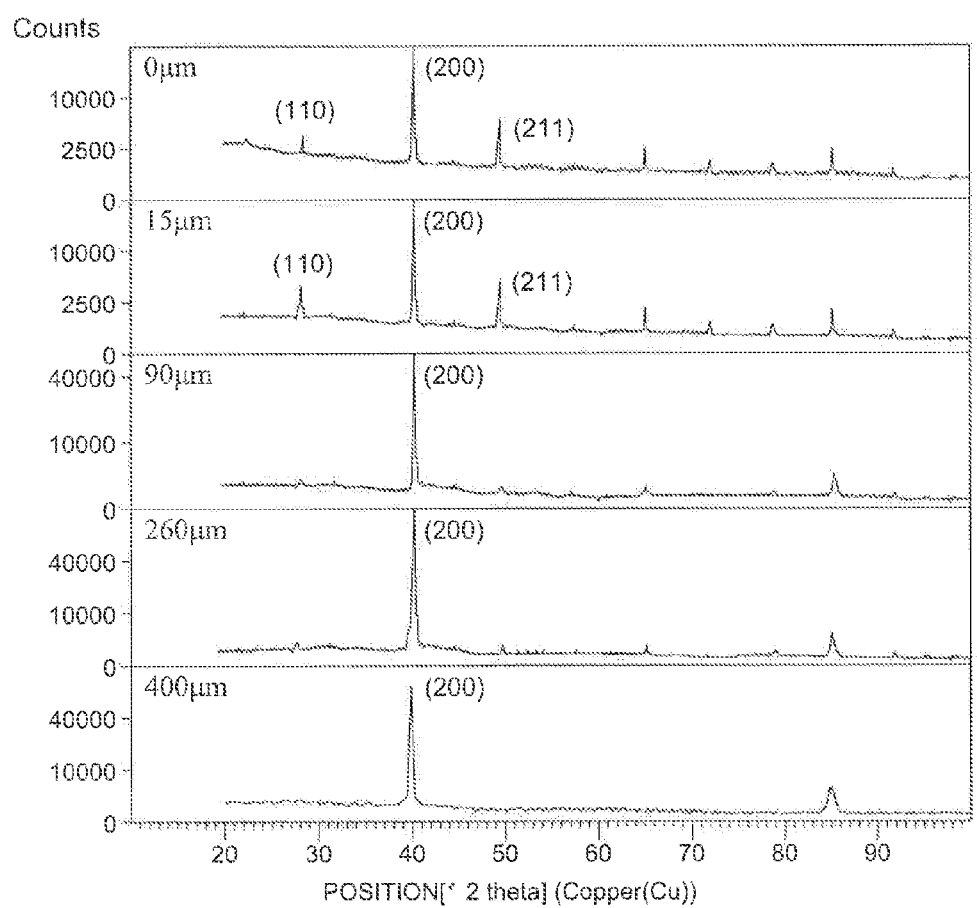
FIG. 5 shows an example of an X-ray diffraction spectrum.

First, XRD measurement was carried out on the substrate side of the phosphor layer. Subsequently, while measuring the layer thickness, the radiation image conversion panel was cut to a predetermined thickness in the layer thickness direction with a diamond knife. Then the orientation was measured at the portion of the predetermined thickness with XRD. This measurement was repeated at 6 points from the bottom to the farthest side (top portion) of the crystal surface of the phosphor layer (refer to FIG. 3 to FIG. 5). Form the results of the measurement, (200) orientation degree at each measuring point was determined.

(Measurement of Emission Luminance)

The radiation image conversion panel (also called as a scintillator panel) was set to a CMOS flat panel having a size of 10 cm×10 cm (X-ray CMOS Camera system Shad-o-Box 4KEV, made by Rad-icon Co., Ltd.). Each Sample was each exposed to X-rays at a voltage of 80 kVp from the rear surface (not having a phosphor layer). The measured count value was defined as the emission luminance (sensitivity). Thus obtained luminance was presented by a relative value, based on the luminance of the comparative radiation image conversion panel (scintillator panel) being 1.0. as shown in Table 2.

The above-described evaluation results are shown in Table 1.

TABLE 1

| | Example | | Comparative example | |
|---|---|---|---|---|
| | Layer thickness position | (200) orientation degree | Layer thickness position | (200) orientation degree |
| | 0 μm | 95% or more | 0 μm | 61% |
| | 20 μm | 95% or more | 15 μm | 75% |
| | 100 μm | 95% or more | 90 μm | 93% |
| | 200 μm | 95% or more | 160 μm | 95% or more |
| | 280 μm | 95% or more | 260 μm | 95% or more |
| | 400 μm | 95% or more | 400 μm | 95% or more |
| Luminance | 1.25 | | 1.00 | |

As can be found by the results shown in Table 1, the Example according to the present invention exhibited extremely enhanced emission luminance.

DESCRIPTION OF SYMBOLS

1: Production device of scintillator panel
2: Vacuum vessel
3: Vacuum pump
4: Support
5: Support holder
6: Support rotation mechanism
7: Support rotation shaft
8: Evaporation source
9: Shutter
A: Radiation image detector
1A: Circuit substrate
2A: Photoelectric element array
3A: Protective layer
4A: Phosphor layer
5A: Sublayer
6A: Light reflection layer
7A: Support
1B: Substrate
2B: Phosphor columnar crystal

What is claimed is:

1. A radiation image conversion panel comprising a substrate having thereon a phosphor layer,
wherein the phosphor layer is composed of a phosphor columnar crystal which is formed from a phosphor matrix compound and an activator with a gas phase deposition process; and
the phosphor columnar crystal has an orientation degree in the range of 80 to 100% from a bottom near to the substrate to a top of the phosphor columnar crystal regardless of a position of the phosphor columnar crystal in a layer thickness direction, provided that the orientation degree is measured on a surface of the phosphor columnar crystal having a predetermined Miller index based on an X-ray diffraction spectrum.

2. The radiation image conversion panel described in claim 1,
wherein the predetermined Miller index is (200).

3. The radiation image conversion panel described in claim 1,
wherein the phosphor matrix compound to form the phosphor columnar crystal is an alkali halide phosphor compound of a cubic crystal.

4. The radiation image conversion panel described in claim 1,
wherein the phosphor matrix compound to form the phosphor columnar crystal is cesium iodide.

5. The radiation image conversion panel described in claim 4,
wherein the activator is thallium.

6. A radiation image detector comprising a photoelectric conversion element which is located facing to the radiation image conversion panel described in claim 1.

* * * * *